United States Patent
Huang et al.

(10) Patent No.: US 11,387,212 B2
(45) Date of Patent: Jul. 12, 2022

(54) METHOD OF TRANSFERRING A PLURALITY OF MICRO LIGHT EMITTING DIODES TO A TARGET SUBSTRATE, ARRAY SUBSTRATE AND DISPLAY APPARATUS THEREOF

(71) Applicant: BOE Technology Group Co., Ltd., Beijing (CN)

(72) Inventors: Guan Huang, Beijing (CN); Yijie Huo, Beijing (CN); Fang Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 717 days.

(21) Appl. No.: 16/346,008

(22) PCT Filed: Mar. 14, 2018

(86) PCT No.: PCT/CN2018/078975
§ 371 (c)(1),
(2) Date: Apr. 29, 2019

(87) PCT Pub. No.: WO2019/173986
PCT Pub. Date: Sep. 19, 2019

(65) Prior Publication Data
US 2021/0335752 A1    Oct. 28, 2021

(51) Int. Cl.
*H01L 23/00* (2006.01)
*H01L 33/00* (2010.01)
*H01L 25/16* (2006.01)

(52) U.S. Cl.
CPC .............. *H01L 24/95* (2013.01); *H01L 24/80* (2013.01); *H01L 24/94* (2013.01); *H01L 25/167* (2013.01);
(Continued)

(58) Field of Classification Search
CPC ..... H01L 24/95; H01L 33/0093; H01L 24/80; H01L 24/94; H01L 25/167; H01L 24/08;
(Continued)

(56) References Cited

U.S. PATENT DOCUMENTS 6,156,626 A * 12/2000 Bothra ..................... H01L 24/05
257/E21.511
7,972,875 B2 * 7/2011 Rogers .................... H01L 33/58
257/E21.243
(Continued)

FOREIGN PATENT DOCUMENTS

CN    101521251 A *   2/2008   ............. H01L 33/00
CN    101521251 A     9/2009
(Continued)

OTHER PUBLICATIONS

International Search Report & Written Opinion dated Dec. 24, 2018, regarding PCT/CN2018/078975.
(Continued)

*Primary Examiner* — Allen L Parker
*Assistant Examiner* — David W Houston, III
(74) *Attorney, Agent, or Firm* — Intellectual Valley Law, P.C.

(57) ABSTRACT

The present application discloses a method for transferring a plurality of micro light emitting diodes (micro LEDs) to a target substrate. The method includes providing a first substrate having an array of the plurality of micro LEDs; providing a target substrate having a bonding layer having a plurality of bonding contacts; applying the plurality of bonding contacts with an electrical potential; aligning the plurality of micro LEDs with the plurality of bonding contacts having the electrical potential; and transferring the plurality of micro LEDs in the first substrate onto the target substrate.

15 Claims, 5 Drawing Sheets

(52) U.S. Cl.
CPC .......... *H01L 33/0093* (2020.05); *H01L 24/08* (2013.01); *H01L 2224/08145* (2013.01); *H01L 2224/80006* (2013.01); *H01L 2224/80143* (2013.01); *H01L 2224/80224* (2013.01); *H01L 2224/80815* (2013.01); *H01L 2224/94* (2013.01); *H01L 2224/95145* (2013.01); *H01L 2924/12041* (2013.01)

(58) Field of Classification Search
CPC . H01L 2224/08145; H01L 2224/80006; H01L 2224/80143; H01L 2224/80224; H01L 2224/80815; H01L 2224/94; H01L 2224/95145; H01L 2924/12041
USPC .......................................................... 438/23
See application file for complete search history.

(56) References Cited

U.S. PATENT DOCUMENTS

| | | | |
|---|---|---|---|
| 2002/0096254 A1* | 7/2002 | Kober | H01L 24/83 257/E31.112 |
| 2002/0158190 A1* | 10/2002 | Dieckroger | G02B 6/136 250/227.11 |
| 2003/0111667 A1* | 6/2003 | Schubert | H01L 33/14 257/E33.068 |
| 2004/0222357 A1* | 11/2004 | King | H01L 31/125 250/214.1 |
| 2006/0078807 A1 | 4/2006 | Chen | |
| 2007/0105250 A1* | 5/2007 | Daniels | H01L 25/50 257/E33.059 |
| 2008/0047939 A1* | 2/2008 | Hummelt | B23K 26/0673 219/121.64 |
| 2008/0173698 A1* | 7/2008 | Marczi | H05K 3/341 228/180.1 |
| 2011/0266561 A1* | 11/2011 | Rogers | H01L 24/72 257/88 |
| 2012/0119241 A1* | 5/2012 | Panaccione | H01L 33/44 257/98 |
| 2012/0181568 A1 | 7/2012 | Hsia et al. | |
| 2012/0320581 A1* | 12/2012 | Rogers | F21V 29/70 257/E33.059 |
| 2014/0064904 A1* | 3/2014 | Bibl | B81C 99/002 414/751.1 |
| 2014/0145200 A1* | 5/2014 | Zhang | H01L 27/1259 438/158 |
| 2014/0159096 A1* | 6/2014 | Hsia | H01L 24/24 257/98 |
| 2014/0169924 A1* | 6/2014 | Golda | H01L 25/167 414/752.1 |
| 2014/0169927 A1* | 6/2014 | Golda | B25J 7/00 414/800 |
| 2015/0229108 A1 | 8/2015 | Steigerwald et al. | |
| 2015/0371585 A1* | 12/2015 | Bower | F21V 9/08 345/82 |
| 2016/0118281 A1 | 4/2016 | Fiorenza | |
| 2017/0062492 A1 | 3/2017 | Bae et al. | |
| 2017/0062671 A1 | 3/2017 | Hashimoto et al. | |
| 2017/0211769 A1* | 7/2017 | Fu | F21S 41/151 |
| 2017/0263593 A1 | 9/2017 | Zou et al. | |
| 2017/0288102 A1 | 10/2017 | Farrens et al. | |
| 2017/0330857 A1 | 11/2017 | Zou et al. | |
| 2017/0358505 A1* | 12/2017 | Chang | H01L 25/167 |
| 2018/0068986 A1* | 3/2018 | Yoo | H05K 999/99 |
| 2018/0083218 A1* | 3/2018 | Choi | H01L 51/5275 |
| 2018/0096977 A1* | 4/2018 | Ahmed | H01L 25/13 |
| 2019/0058099 A1* | 2/2019 | Oh | H01L 25/50 257/E33.059 |
| 2019/0244937 A1 | 8/2019 | Honjo et al. | |

FOREIGN PATENT DOCUMENTS

| | | |
|---|---|---|
| CN | 102593275 A | 7/2012 |
| CN | 106165218 A | 11/2016 |
| CN | 107369647 A | 11/2017 |
| JP | 2008516450 A | 5/2008 |
| JP | 2017050321 A | 3/2017 |
| JP | 2017157724 A | 9/2017 |
| JP | 2017537476 A | 12/2017 |
| JP | 2018501636 A | 1/2018 |
| JP | 2018503986 A | 2/2018 |

OTHER PUBLICATIONS

Laser lift-off transfer printing of patterned GaN light-emitting diodes from sapphire to flexible substrates using a Cr/Au laser blocking layer; Jaeyi Chunn; Scripta Materialia; ISSN 1359-6462; CODEN SCMAF7; v. 77; p. 13-16.

Transfer of GaN LEDs from Sapphire to Flexible Substrates by Laser Lift-Off and Contact Printing; Jaeyi Chun; IEEE Photonics Technology Letters; vol. 24; Issue: 23; Dec. 1, 2012; p. 2115-2118.

First Office Action in the Chinese Patent Application No. 201880000158. 5, dated Dec. 29, 2021; English translation attached.

First Office Action in the Japanese Patent Application No. 2020531488, dated Feb. 15, 2022; English translation attached.

\* cited by examiner

METHOD OF TRANSFERRING A PLURALITY OF MICRO LIGHT EMITTING DIODES TO A TARGET SUBSTRATE, ARRAY SUBSTRATE AND DISPLAY APPARATUS THEREOF

CROSS-REFERENCE TO RELATED APPLICATION

This application is a national stage application under 35 U.S.C. § 371 of International Application No. PCT/CN2018/078975, filed Mar. 14, 2018, the contents of which are incorporated by reference in the entirety.

TECHNICAL FIELD

The present invention relates to display technology, more particularly, to a method for transferring a plurality of micro light emitting diodes to a target substrate, an array substrate having the plurality of micro LEDs transferred by the method, and a display apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides a method for transferring a plurality of micro light emitting diodes (micro LEDs) to a target substrate, comprising providing a first substrate having an array of the plurality of micro LEDs; providing a target substrate having a bonding layer comprising a plurality of bonding contacts; applying the plurality of bonding contacts with an electrical potential; aligning the plurality of micro LEDs with the plurality of bonding contacts having the electrical potential; and transferring the plurality of micro LEDs in the first substrate onto the target substrate.

Optionally, each of the plurality of micro LEDs comprises a micro p-n diode and a metallization block on the micro p-n diode; and aligning the plurality of micro LEDs with the plurality of bonding contacts comprises aligning the metallization block with one of the plurality of bonding contacts applied with the electrical potential, the metallization block is placed between the micro p-n diode and one of the plurality of bonding contacts.

Optionally, aligning the plurality of micro LEDs with the plurality of bonding contacts comprises placing the first substrate and the target substrate so that the first substrate and the target substrate face each other; and moving the first substrate and the target substrate toward each other.

Optionally, applying the plurality of bonding contacts with the electrical potential is performed during moving the first substrate and the target substrate toward each other.

Optionally, applying the plurality of bonding contacts with the electrical potential comprises applying the electrical potential to a signal line commonly connected to the plurality of bonding contacts.

Optionally, the target substrate comprises an array of a plurality of thin film transistors, each of which comprising a drain electrode electrically connected to one of the plurality of bonding contacts, a source electrode electrically connected to a common electrode, and a gate electrode; wherein applying the electrical potential to the signal line commonly connected to the plurality of bonding contacts comprises applying a plurality of gate scanning signals respectively to a plurality of gate electrodes of the plurality of thin film transistors to turn on the plurality of thin film transistors; and applying the electrical potential to the common electrode electrically connected to a plurality of source electrode of the plurality of thin film transistors thereby applying the electrical potential to the plurality of bonding contacts.

Optionally, the first substrate is a growth substrate.

Optionally, the first substrate is a flexible earner substrate; the method further comprises fabricating the plurality of micro LEDs on a growth substrate; and transferring the plurality of micro LEDs in the growth substrate onto the first substrate.

Optionally, prior to transferring the plurality of micro LEDs in the first substrate onto the target substrate, the method further comprises adjusting a first pitch of the plurality of micro LEDs in the first substrate such that the first pitch matches with a second pitch of the plurality of bonding contacts in the target substrate.

Optionally, transferring the plurality of micro LEDs onto the target substrate comprises debonding the plurality of micro LEDs from the first substrate.

Optionally, transferring the plurality of micro LEDs onto the target substrate composes debonding the plurality of micro LEDs from the first substrate by laser lift-off.

Optionally, subsequent to transferring the plurality of micro LEDs onto the target substrate, the method further comprises soldering the plurality of micro LEDs respectively onto the plurality of bonding contacts.

Optionally, soldering the plurality of micro LEDs respectively onto the plurality of bonding contacts is performed by reflow soldering.

Optionally, soldering the plurality of micro LEDs respectively onto the plurality of bonding contacts is performed by laser-assisted soldering.

Optionally, the electrical potential is a positive electrical potential.

Optionally, subsequent to transferring the plurality of micro LEDs onto the target substrate, the method further comprises moving the first substrate away from the target substrate.

In another aspect, the present invention provides an array substrate comprising the plurality of micro LEDs transferred by the method described herein.

In another aspect the present invention provides a display apparatus comprising the array substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a micro light emitting diode (micro LED) display panel, each of the micro LED has to be transferred from a growth substrate to a target substrate. Considering the display panel includes thousands to millions of micro LEDs, a pick-and-place transfer process is extremely time-consuming, and thus not suitable for large-scale fabrication of micro LED display panels. An improvement to the pick-and-place transfer is to use a printing head for transferring a plurality of micro LEDs at one time. Still, a process of transferring a large number of micro LEDs using a panting head is too complicated and tune-consuming. Moreover, misalignment between the micro LEDs and the bonding contacts in the target substrate occurs frequently in the pick-and-place transfer or the transfer process using a panting head, resulting in defects in the display panel.

Accordingly, the present disclosure provides, inter aha, a method for transferring a plurality of micro light emitting diodes to a target substrate, an array substrate having the plurality of micro LEDs transferred by the method, and a display apparatus that substantially obviate one or more of the problems due to limitations and disadvantages of the related art. In one aspect, the present disclosure provides a method for transferring a plurality of micro light emitting diodes to a target substrate. In some embodiments, the method me hides providing a first substrate having an array of the plurality of micro LEDs; providing a target substrate having a bonding layer comprising a plurality of bonding contacts; applying the plurality of bonding contacts with an electrical potential; aligning the plurality of micro LEDs with the plurality of bonding contacts having the electrical potential; and transferring the plurality of micro LEDs in the first substrate onto the target substrate.

Figure 1A:
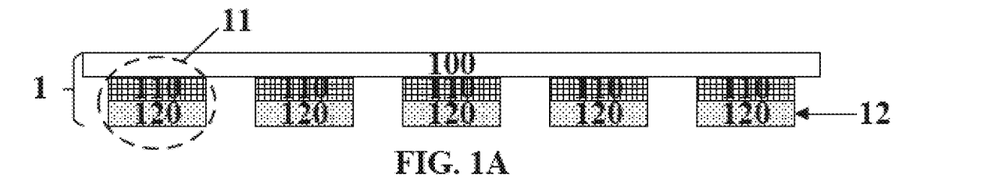
FIGS. 1A to 1F illustrate a process of transferring a plurality of micro light emitting diodes to a target substrate in some embodiments according to the present disclosure.
Figure 1B:
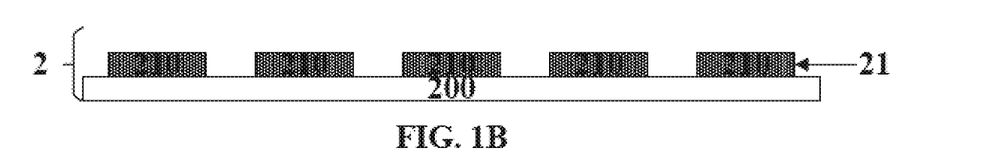
Figure 1C:
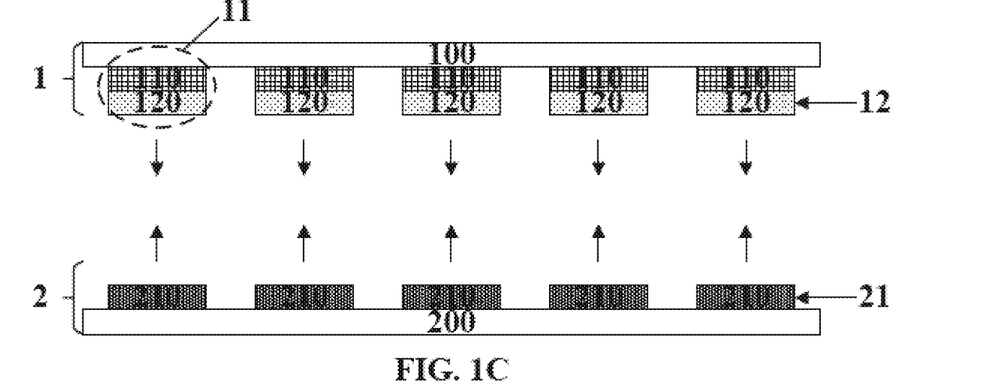
Figure 1D:
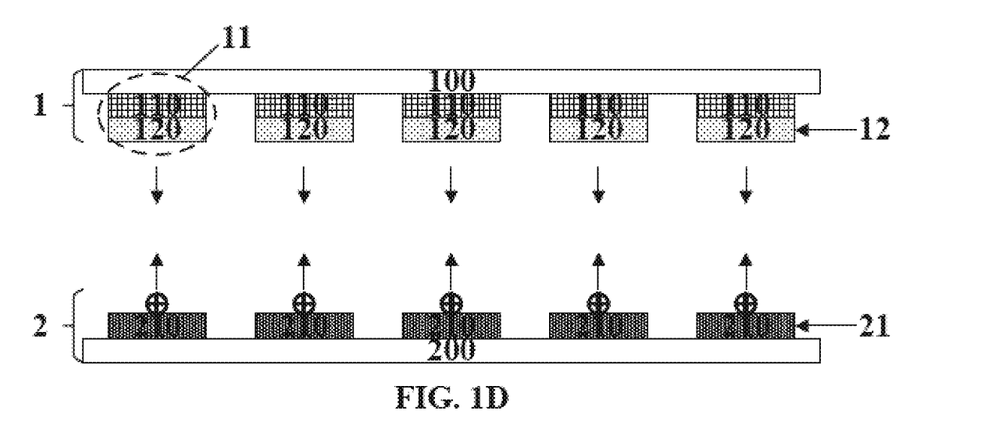
Figure 1E:
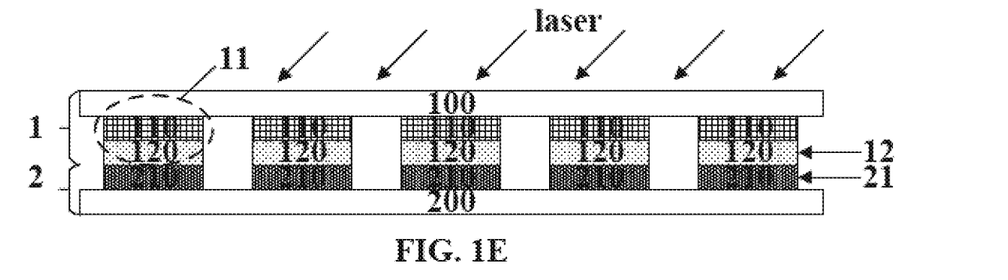
Figure 1F:
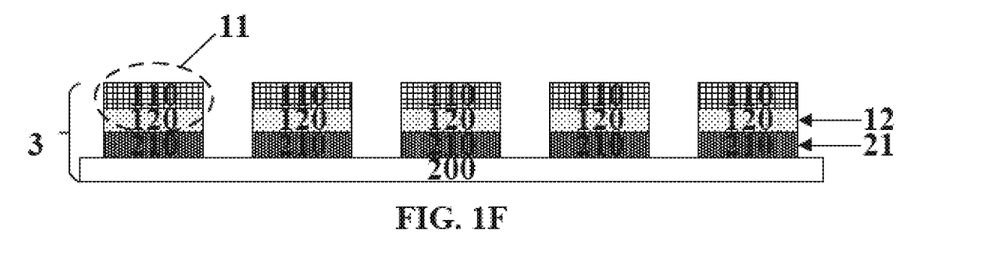

FIGS. 1A to 1F illustrate a process of transferring a plurality of micro light emitting diodes to a target substrate in some embodiments according to the present disclosure. Referring to FIG. 1A, the method in some embodiments includes providing a first substrate 1 having an array of the plurality of micro LEDs 11 on a first base substrate 100. Referring to FIG. 1B, the method in some embodiments further includes providing a target substrate 2 having a bonding layer 21 including a plurality of bonding contacts 210 on a second base substrate 200. Referring to FIG. 1C, the method in some embodiments bather includes placing the first substrate 1 and the target substrate 2 so that the first substrate 1 and the target substrate 2 face each other; and moving the first substrate 1 and the target substrate 2 toward each other. Referring to FIG. 1D, the method in some embodiments further includes applying the plurality of bonding contacts 210 with an electrical potential (e.g., a positive electrical potential, indicated as positive charges in FIG. 1D), and aligning the plurality of micro LEDs 11 with the plurality of bonding contacts 210 having the electrical potential. Referring to FIG. 1E, the method in some embodiments birther includes transferring the plurality of micro LEDs 11 in the first substrate 1 onto the target substrate 2. Referring to FIG. 1F, the method in some embodiments further includes moving the first substrate 1 away from the target substrate 2, thereby forming an array substrate 3. The array substrate 3 includes the plurality of micro LEDs 11 transferred to the plurality of bonding contacts 210.

Optionally, the electrical potential applied to the plurality of bonding contacts 210 is a positive electrical potential (e.g., greater than 1 V, greater than 5V, and greater than 10V). Optionally, the electrical potential applied to the plurality of bonding contacts 210 is a negative electrical potential (e.g., lower than −1 V, lower than −5V, and lower than −10V).

In the present method, the alignment of the plurality of micro LEDs 11 with the plurality of bonding contacts 210 is assisted by the electrical potential applied to the bonding layer 21. The electrical potential on the plurality of bonding contacts 210 polarizes the plurality of micro LEDs 11 during the alignment process, thereby generating an attractive force between the plurality of bonding contacts 210 and the plurality of micro LEDs 11 (now being polarized). The attractive force greatly enhances the accuracy and reliability of the alignment process, achieving highly efficient and precise transfer of the plurality of micro LEDs 11 from the first substrate 1 to the target substrate 2.

In some embodiments, each of the plurality of micro LEDs 11 includes a micro p-n diode 110 and a metallization block 120 on the micro p-n diode 110. The step of aligning the plurality of micro LEDs 11 with the plurality of bonding contacts 210 includes aligning the metallization block 120 with one of the plurality of bonding contacts 210 applied with the electrical potential, the metallization block 120 is placed between the micro p-n diode 110 and one of the plurality of banding contacts 210 during the alignment process. Optionally, the bonding layer 21 is applied with the electrical potential during the entire alignment process. Optionally, the step of applying the plurality of bonding contacts 210 with the electrical potential is performed during moving the first substrate 1 and the target substrate 2 toward each other. Optionally, the step of applying the plurality of bonding contacts 210 with the electrical potential is performed prior to the step of moving the first substrate 1 and the target substrate 2 toward each other. Optionally, the step of applying the plurality of bonding contacts 210 with the electrical potential is performed prior to the step of moving the first substrate 1 and the target substrate 2 toward each other, and the electrical potential at the plurality of bonding contacts 210 is maintained throughout the step of moving the first substrate 1 and the target substrate 2 toward each other until the alignment process is finished.

In some embodiments, the micro p-n diode 110 includes a compound semiconductor having a band gap corresponding to a specific region in the spectrum. Optionally, the micro p-n diode 110 includes one or more layers based on II-VI materials (e.g. ZnSe) or BIN nitride materials (e.g. GaN, AlN, InN, and their alloys). Optionally, the micro p-n diode 110 is formed on a first base substrate 100. Optionally, the first base substrate 100 is a growth substrate. Optionally, the first base substrate 100 is a flexible carrier substrate. Optionally, the growth substrate is made of one or a combination of silicon, SiC, GaAs, GaN and sapphire (Al2O3). Optionally, the first base substrate 100 is a sapphire growth substrate and the micro p-n diode 110 is formed of GaN.

In some embodiments, the first substrate 1 includes a metallization layer 12 having multiple ones of the metallization blocks 120 in the plurality of micro LEDs 11. Optionally, the metallization layer 12 includes an electrode layer and optionally a barrier layer. In one example, the electrode layer makes ohmic contact to a p-doped GaN layer of the micro p-n diode 110. Optionally, the electrode layer inches a high work-function metal such as Ni, Au, Ag, Pd and Pt Optionally, the electrode layer is made of a reflective material. Optionally, the electrode layer is made of a transparent material. The barrier layer functions to prevent diffusion of impurities into the micro p-n diode 110, for example, prevent diffusion of components from the bonding layer into the micro p-n diode 110. Optionally, the barrier layer includes Pd, Pt, Ni, Ta, Ti and TiW.

Optionally, the metallization layer 12 has a thickness in a range of approximately 0.1 μm to approximately 20 μm, e.g., approximately 0.1 μm to approximately 0.2 μm, approximately 0.2 μm to approximately 0.5 μm, approximately 0.5 μm to approximately 1 μm, approximately 1 μm to approximately 2 μm, approximately 2 μm to approximately 5 μm, approximately 5 μm to approximately 10 μm, approximately 10 μm to approximately 15 μm, and approximately 15 μm to approximately 20 μm.

Various appropriate materials and various appropriate fabricating methods rimy be used for forming the bonding layer 21. Examples of appropriate bonding layer materials include indium, tin, gold, silver, molybdenum, aluminum, and laminates or alloys thereof. Optionally, the bonding layer 21 has a thickness in a range of approximately 0.1 μm to approximately 5 μm, e.g., approximately 0.1 μm to approximately 0.2 μm, approximately 0.2 μm to approximately 0.5 μm, approximately 0.5 μm to approximately 1 μm, approximately 1 μm to approximately 2 μm, approximately 2 μm to approximately 3 μm, approximately 3 μm approximately 5 μm and approximately 4 μm to approximately 5 μm.

Figure 2:
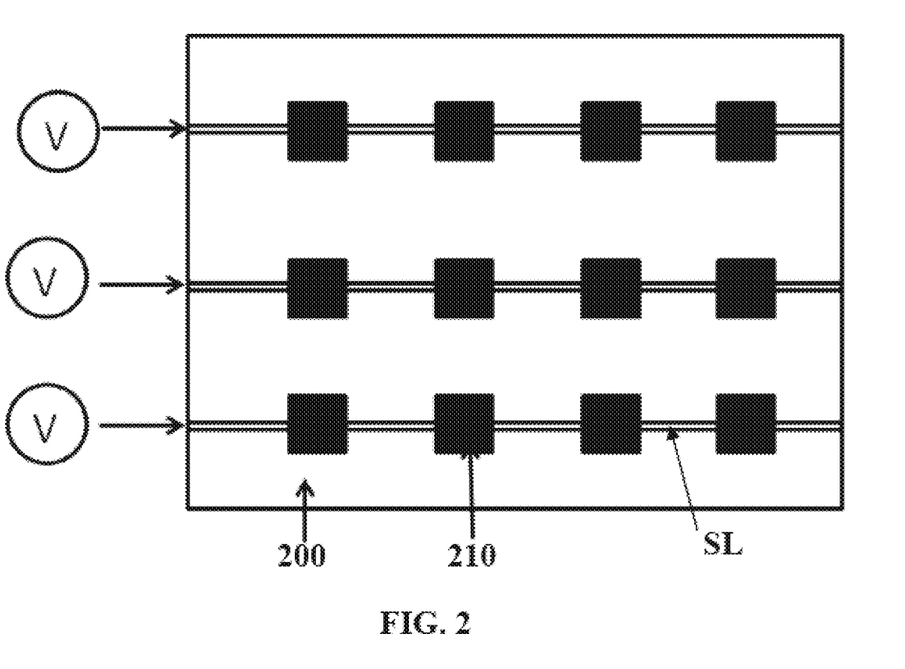
FIG. 2 illustrates a process of applying an electrical potential to the plurality of bonding contacts in a target substrate in some embodiments according to the present disclosure.

In some embodiments, the step of applying the bonding layer 21 with the electrical potential includes applying the electrical potential to a signal line commonly connected to the plurality of bonding contacts 210. FIG. 2 illustrates a process of applying an electrical potential to the plurality of bonding contacts in a target substrate in some embodiments according to the present disclosure. Referring to FIG. 2 an electrical potential V is applied to the plurality of bonding contacts 210 through a signal line SL commonly connected to the plurality of bonding contacts 210. In one example, the plurality of micro LEDs 11 are transferred to a target substrate for slaking a passive matrix micro LED display panel. Optionally, the electrical potential is applied to the plurality of bonding contacts 210 through a common electrode signal line commonly connected to the plurality of bonding contacts 210.

Figure 3:
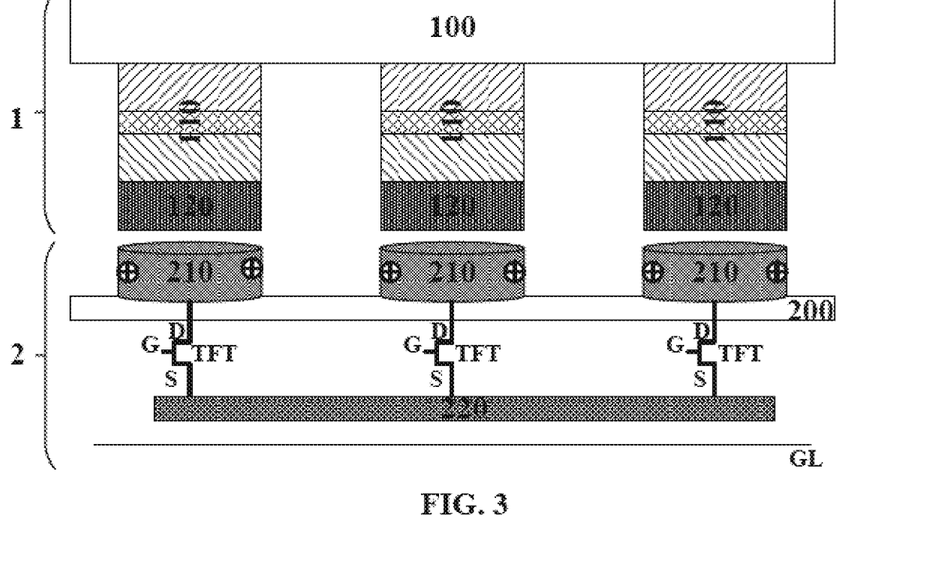
FIG. 3 is a schematic diagram illustrating the structure of a first substrate and a target substrate during a process of transferring a plurality of micro light emitting diodes to the target substrate in some embodiments according to the present disclosure.

FIG. 3 is a schematic diagram illustrating the structure of a first substrate and a target substrate dig a process of transferring a plurality of micro light emitting diodes to the target substrate in some embodiments according to, the present disclosure. Referring to FIG. 3, the target substrate 2 includes an array of a plurality of thin film transistors TFT. Each of the plurality of thin film transistors TFT includes a drain electrode D electrically connected to one of the plurality of bonding contacts 210, a source electrode S electrically connected to a common electrode 220, and a gate electrode G electrically connected to a gate line GL. In some embodiments, the step of applying the electrical potential to the signal line commonly connected to the plurality of bonding contacts 210 includes applying a plurality of gate scanning signals respectively to a plurality of gate electrodes of the plurality of thin film transistors TFT to turn on the plurality of thin film transistors TFT; and applying the electrical potential to the common electrode 220 electrically connected to a plurality of source electrode of the plurality of thin film transistors TFT thereby applying the electrical potential to the plurality of bonding contacts 210. Optionally, the common electrode 220 is a cathode.

Figure 4A:
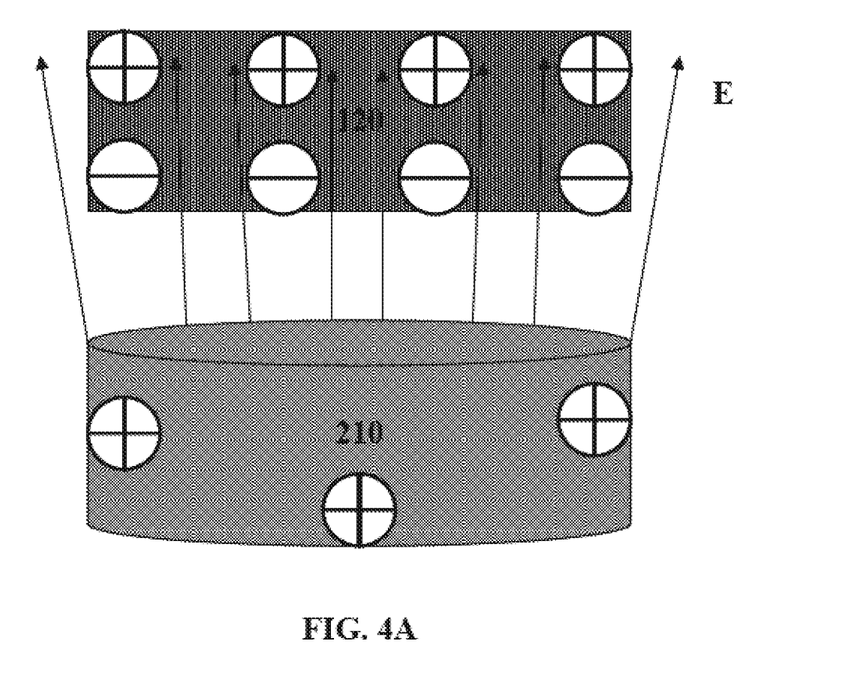
FIGS. 4A and 4B illustrate an electrical field-assisted alignment of a plurality of micro light emitting diodes with a plurality of bonding contacts in some embodiments according to the present disclosure.

FIGS. 4A and 4B illustrate an electrical field-assisted alignment of a plurality of micro light emitting diodes with a plurality of bonding contacts in some embodiments according to the present disclosure. Referring to FIG. 4A, the electrical potential applied to one of the plurality of bonding contacts 210 forms an electrical field E, which polarizes one of the plurality of metallization blocks 120. The electrical field E induces a polarized charge distribution in the one of the plurality of metallization blocks 120. In one example, and as shown in FIG. 4A, the electrical potential is a positive electrical potential. The electrical field E induces a polarized charge distribution in the one of the plurality of metallization blocks 120 such that negative charges accumulate on a first side of the one of the plurality of metallization blocks 120 proximal to the one of the plurality of bonding contacts 210, and positive charges accumulate on a second side of the one of the plurality of metallization blocks 120 distal to the one of the plurality of bonding contacts 210. The first side of the one of the plurality of metallization blocks 120 having the negative charges accumulated is attracted to the one of the plurality of bonding contacts 210. Due to this attractive force between the one of the plurality of metallization blocks 120 and the one of the plurality of bonding contacts 210, they are aligned with respect to each other.

Figure 4B:
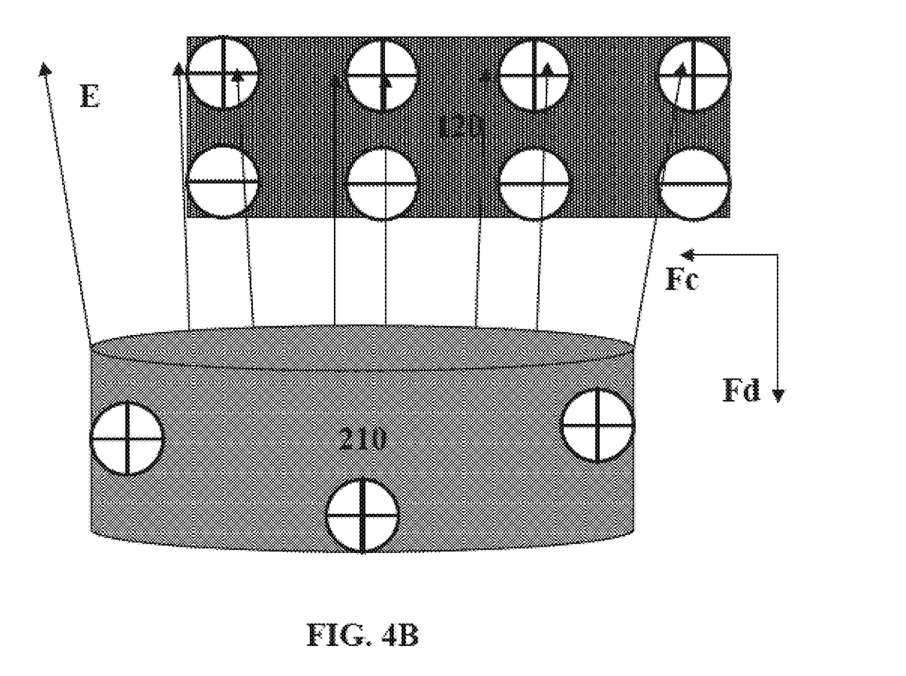

Referring to FIG. 4B, the one of the plurality of metallization blocks 120 and the one of the plurality of bonding contacts 210 are misaligned. Due to the distribution of the electrical field E, the one of the plurality of metallization blocks 120 is subject to two forces, a first force Fd pulling the one of the plurality of metallization blocks 120 toward the one of the plurality of bonding contacts 210, and a second force Fc re aligning the one of the plurality of metallization blocks 120 and the one of the plurality of bonding contacts 210 with respect to each other.

In some embodiments, the step of transferring the plurality of micro LEDs 11 onto the target substrate 2 includes debonding the plurality of micro LEDs 11 from the first substrate 1. Various appropriate debonding methods may be used for debonding the plurality of micro LEDs 11 from the first substrate 1. In some embodiments, a laser lift-off process can be performed to separate the plurality of micro LEDs 11 from the first substrate 1 (see FIG. 1E). The laser lift-off process uses a collimated high-energy UV laser beam (e.g., 266 nm). Optionally, the laser lift-off process is an excimer laser lift-off process. In some embodiments, a chemical lift-off process can be performed to separate the plurality of micro LEDs 11 from the first substrate 1. In some embodiments, a mechanical lift-off process can be performed to separate the plurality of micro LEDs 11 from the first substrate 1. In some embodiments, the step of debonding the plurality of micro LEDs 11 from the first substrate 1 includes one or a combination of a laser lift-off process, a chemical lift-off process, and a mechanical lift-off process. Optionally, the plurality of micro LEDs 11 are then immersed in a bath (e.g., an acetone bath) to further separate the plurality of micro LEDs 11 from the first substrate 1.

In some embodiments, subsequent to transferring the plurality of micro LEDs 11 onto the target substrate 2, the method further includes soldering the plurality of micro LEDs 11 respectively onto the plurality of bonding contacts 210. Optionally, the step of soldering the plurality of micro LEDs 11 respectively onto the plurality of bonding contacts 210 is performed by reflow soldering. Optionally, the step of soldering the plurality of micro LEDs 11 respectively onto the plurality of bonding contacts 210 is performed by laser-assisted soldering in which laser radiation is absorbed by the plurality of bonding contacts 210 thereby soldering the plurality of micro LEDs 11 respectively onto the plurality of bonding contacts 210. Optionally, the step of soldering the plurality of micro LEDs 11 respectively onto the plurality of bonding contacts 210 is performed by laser welding. Optionally, the step of soldering the plurality of micro LEDs 11 respectively onto the plurality of bonding contacts 210 is performed by infrared soldering.

In some embodiments, the first substrate 1 is a growth substrate, and the plurality of macro LEDs 11 are directly transferred to a target substrate 2 to form an array substrate having the plurality of micro LEDs 11.

In some embodiments, the first substrate 1 is a carrier substrate, e.g., a flexible carrier substrate. Accordingly, prior to transferring the plurality of micro LEDs 11 from the first substrate 1 to the target substrate 2, the method in some embodiments further includes fabricating the plurality of micro LEDs 11 on a growth substrate; and transferring the plurality of micro LEDs 11 in the growth substrate onto the first substrate 1.

In some embodiments, prior to transferring the plurality of micro LEDs 11 in the first substrate 1 onto the target substrate 2, the method farther includes adjusting a first pitch of the plurality of micro LEDs 11 in the first substrate 1 such that the first pitch matches with a second pitch of the plurality of bonding contacts 210 in the target substrate. Optionally, the first pitch of the plurality of micro LEDs 11 in the first substrate 1 is adjusted by stretching the first substrate 1 (e.g., a flexible carrier substrate).

Figure 5:
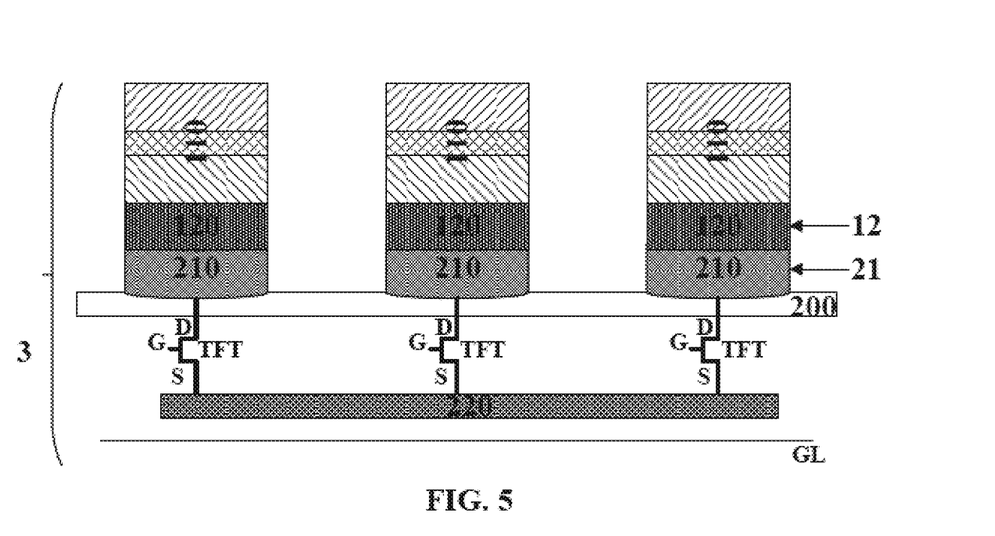
FIG. 5 is a schematic diagram illustrating the structure of an array substrate having a plurality of micro LEDs transferred by a transferring method in some embodiments according to the present disclosure.

In another aspect, the present disclosure provides an array substrate having a plurality of micro LEDs transferred by a method described herein. FIG. 5 is a schematic diagram illustrating the structure of an array substrate having a plurality of micro LEDs transferred by a transferring method in some embodiments according to the present disclosure. Referring to FIG. 5, the array substrate 3 in some embodiments includes a second base substrate 200, a bonding layer 21 having a plurality of bonding contacts 210 on the second base substrate 200, a metallization layer 12 having a plurality of metallization blocks 120 and on a side of the bonding layer 21 distal to the second base substrate 200, and a plurality of micro p-n diodes 110 on a side of the metallization layer 12 distal to the bonding layer 21.

In another aspect the present disclosure provides a display apparatus having an array substrate described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for transferring a plurality of micro light emitting diodes (micro LEDs) to a target substrate, comprising:
   providing a first substrate having an array of the plurality of micro LEDs;
   providing a target substrate having a bonding layer comprising a plurality of bonding contacts;
   applying the plurality of bonding contacts with an electrical potential;
   aligning the plurality of micro LEDs with the plurality of bonding contacts having the electrical potential; and
   transferring the plurality of micro LEDs in the first substrate onto the target substrate;
   wherein each of the plurality of micro LEDs comprises a micro p-n diode and a metallization block on the micro p-n diode; and
   aligning the plurality of micro LEDs with the plurality of bonding contacts comprises aligning the metallization block with one of the plurality of bonding contacts applied with the electrical potential, the metallization block is placed between the micro p-n diode and one of the plurality of bonding contacts;
   wherein aligning the plurality of micro LEDs with the plurality of bonding contacts comprises:
   placing the first substrate and the target substrate so that the first substrate and the target substrate face each other; and
   moving the first substrate and the target substrate toward each other;

wherein applying the plurality of bonding contacts with the electrical potential is performed during moving the first substrate and the target substrate toward each other.

2. The method of claim 1, wherein applying the plurality of bonding contacts with the electrical potential comprises applying the electrical potential to a signal line commonly connected to the plurality of bonding contacts.

3. The method of claim 1, wherein the first substrate is a growth substrate.

4. The method of claim 1, wherein the first substrate is a flexible carrier substrate;
the method further comprises:
fabricating the plurality of micro LEDs on a growth substrate; and
transferring the plurality of micro LEDs in the growth substrate onto the first substrate.

5. The method of claim 4, wherein prior to transferring the plurality of micro LEDs in the first substrate onto the target substrate, further comprising:
adjusting a first pitch of the plurality of micro LEDs in the first substrate such that the first pitch matches with a second pitch of the plurality of bonding contacts in the target substrate.

6. The method of claim 1, wherein transferring the plurality of micro LEDs onto the target substrate comprises debonding the plurality of micro LEDs from the first substrate.

7. The method of claim 1, wherein transferring the plurality of micro LEDs onto the target substrate comprises debonding the plurality of micro LEDs from the first substrate by laser lift-off.

8. The method of claim 1, wherein subsequent to transferring the plurality of micro LEDs onto the target substrate, further comprising soldering the plurality of micro LEDs respectively onto the plurality of bonding contacts.

9. The method of claim 8, wherein soldering the plurality of micro LEDs respectively onto the plurality of bonding contacts is performed by reflow soldering.

10. The method of claim 8, wherein soldering the plurality of micro LEDs respectively onto the plurality of bonding contacts is performed by laser-assisted soldering.

11. The method of claim 1, wherein the electrical potential is a positive electrical potential.

12. The method of claim 1, wherein subsequent to transferring the plurality of micro LEDs onto the target substrate, further comprising moving the first substrate away from the target substrate.

13. An array substrate, comprising the plurality of micro LEDs transferred by the method of claim 1.

14. A display apparatus, comprising the array substrate of claim 13.

15. A method for transferring a plurality of micro light emitting diodes (micro LEDs) to a target substrate, comprising:
providing a first substrate having an array of the plurality of micro LEDs;
providing a target substrate having a bonding layer comprising a plurality of bonding contacts;
applying the plurality of bonding contacts with an electrical potential;
aligning the plurality of micro LEDs with the plurality of bonding contacts having the electrical potential; and
transferring the plurality of micro LEDs in the first substrate onto the target substrate:
wherein applying the plurality of bonding contacts with the electrical potential comprises applying the electrical potential to a signal line commonly connected to the plurality of bonding contacts;
wherein the target substrate comprises an array of a plurality of thin film transistors, each of which comprising a drain electrode electrically connected to one of the plurality of bonding contacts, a source electrode electrically connected to a common electrode, and a gate electrode;
wherein applying the electrical potential to the signal line commonly connected to the plurality of bonding contacts comprises:
applying a plurality of gate scanning signals respectively to a plurality of gate electrodes of the plurality of thin film transistors to turn on the plurality of thin film transistors; and
applying the electrical potential to the common electrode electrically connected to a plurality of source electrode of the plurality of thin film transistors thereby applying the electrical potential to the plurality of bonding contacts.

* * * * *